United States Patent [19]

Wauk, II et al.

[11] Patent Number: 5,126,576

[45] Date of Patent: Jun. 30, 1992

[54] METHOD AND APPARATUS FOR CONTROLLING THE RATE OF EMISSION OF ELECTRONS USED FOR CHARGE NEUTRALIZATION IN ION IMPLANTATION

[75] Inventors: Michael T. Wauk, II, West Sussex; Bernard Woods, East Sussex, both of England; Jose-Antonio Marin, San Jose, Calif.; Nicholas J. Bright, West Sussex, England

[73] Assignee: Applied Materials, Inc., Santa Clara, Calif.

[21] Appl. No.: 626,897

[22] Filed: Dec. 13, 1990

[51] Int. Cl.⁵ ............................................. H01J 37/00
[52] U.S. Cl. ............................. 250/492.2; 250/492.3
[58] Field of Search ............ 250/492.21, 492.2, 492.3, 250/427; 204/192.31

[56] References Cited

U.S. PATENT DOCUMENTS

| | | | |
|---|---|---|---|
| 4,639,301 | 1/1987 | Doherty et al. | 204/192.31 |
| 4,675,530 | 1/1987 | Rose et al. | 250/492.2 |
| 4,874,947 | 10/1989 | Ward et al. | 250/309 |
| 5,072,125 | 12/1991 | Nakanishi et al. | 250/492.21 |

*Primary Examiner*—Jack I. Berman
*Assistant Examiner*—James E. Beyer
*Attorney, Agent, or Firm*—Noel F. Heal

[57] ABSTRACT

Method and apparatus for the control of the rate of emission of electrons added to an ion implantation beam to neutralize charging effects on semiconductor wafers being processed. A net charging current, or equivalent voltage, is sensed continuously, but is sampled only when a selected wafer, or multiple selected wafers, are positioned to receive the entire cross section of the ion beam. The sampled charging current is used to control the addition of charge-neutralizing electrons to the ion beam, thereby eliminating problems that ensue from the use of an averaged charging current that is sensed without regard to the relative beam position or the number of wafers being processed.

10 Claims, 2 Drawing Sheets

METHOD AND APPARATUS FOR CONTROLLING THE RATE OF EMISSION OF ELECTRONS USED FOR CHARGE NEUTRALIZATION IN ION IMPLANTATION

BACKGROUND OF THE INVENTION

This invention relates generally to ion implantation systems used in the fabrication of semiconductor devices and, more particularly, to systems for the control of charging currents absorbed by semiconductor wafers subjected to the implantation processing. Ion implantation is an important process step in the fabrication of integrated circuits on semiconductor wafers. Although the high density and speed of modern integrated circuits are largely a result of improvements in the accuracy and resolution of lithography and etching apparatus used in the manufacturing process, the density and speed are also dependent to some degree upon tight control of the profile of doped regions of the wafer. Control of doping of wafer regions with conductivity-modifying impurities can best be achieved using ion implantation techniques.

In a typical ion implantation process, semiconductor wafers are subjected to a broad and fairly uniform beam of ions, or charged atoms. A region of the semiconductor wafer can have its conductivity properties modified by subjecting it to bombardment by a beam of ions of a selected impurity. Regions to be treated by ion implantation are defined on the semiconductor wafer by an etched pattern in a previously formed layer known as a resist layer. The depth of implantation and the resultant properties of the region are largely dependent on the beam properties, such as the energy of the ions, beam density, time of exposure to the beam, and so forth. These considerations are now well understood in the art of semiconductor fabrication, and are beyond the scope of the present invention.

The present invention is concerned with only one aspect of the ion implantation process, namely a difficulty that arises from the buildup of electrical charge on the wafer, due to its bombardment by charged particles. For example, when a semiconductor gate region is subjected to ion implantation treatment, it becomes positively charged with respect to an underlying substrate, from which it is typically separated by a dielectric layer. Without intervention, the gate may become so highly charged that the dielectric material breaks down, or becomes structurally weakened. One well known solution to this difficulty is to use an electron flood device to add electrons to the beam. Because the electron and ion velocities are substantially different and the electrons are spatially separated from the ions, there is little, if any, reaction between the ions and electrons in the beam, and the electrons have no significant effect on the ion implantation process. However, if the generation of electrons is properly controlled the net charging current applied to the semiconductor wafer can be reduced to practically zero.

Up to this point, it has been tacitly assumed that only one semiconductor wafer is being treated, and that the ion beam is large enough in cross section to treat the entire wafer. As a practical matter, this is not the case. A typical semiconductor wafer may be about 6 inches (15 cm) in diameter, but it is impractical, or at least very expensive, to produce an ion beam of more than about 5 cm in cross-sectional width. Accordingly, there must be some technique for scanning the beam across the wafer, or scanning the wafer with respect to the beam. Further, it is desirable from an efficiency standpoint to be able to treat many wafers at the same time in a single apparatus.

A typical processing device for ion implantation can treat twenty or more wafers together by having them mounted on the spokes of a large wheel, which is rotated at high speed (about 1,250 rpm) through the ion beam. This exposes successive wafers to the beam, but does not expose the entire width of each wafer. Therefore, the wheel is also angularly precessed. That is to say, its axis is scanned laterally from side to side at a relatively slow rate, to ensure that the entire width of each wafer is exposed to the beam.

In ion implantation systems of the prior art, the net charging current to which the wafer-supporting wheel is subjected is measured, and used to control operation of the electron flood device, in an effort to neutralize the charging current. The wheel is electrically conductive, and the wafers are carried on heat sinks on the wheel spokes, to help dissipate the heat generated as a result of the ion implantation process. Electrical contact with the wheel is made through a slip-ring or similar device at the wheel hub; and the magnitude of the sensed current is used in a conventional control system to vary the rate at which electrons are injected into the beam.

Although the typical prior art control system described above operates satisfactorily in most respects, it has some significant drawbacks, due in part to variations in the charging current as the wheel turns about its axis. One such variation is caused by the potential absence of wafers from some positions of the wheel. If less than a full batch of wafers is being processed, the empty wafer positions are usually filled by dummy wafers, to avoid damage to the wafer heat sinks if they were exposed to the ion beam. However, the dummy wafers do not have exactly the same physical and electrical characteristics as the real wafers. One component of charging current results from secondary electrons dislodged from the wafers by impinging ions. This secondary effect may be significantly different on the dummy wafers, so that a current measured as the "average" of charging currents on all of the wafers may not be an appropriate control signal to neutralize charge on the real wafers. Another variation in charging current occurs as a result of the beam's impingement on portions of the wheel other than where a wafer is carried. Because the wafers have to be scanned laterally across the beam, providing this full beam coverage of the wafers requires that the beam must also impinge on other portions of the wheel. Secondary emission effects when the beam is impinging on the wheel itself are also different from corresponding effects when the beam is positioned over a wafer. Therefore, inclusion of these effects in the measured "average" charging current yields a control signal that is not an accurate measure of the charging current applied to the wafers.

Accordingly, there is still a need for improvement in the control of ion implantation beams, to neutralize charging current applied to the wafers being processed. The present invention is directed to this end.

SUMMARY OF THE INVENTION

The present invention resides in a method, and corresponding apparatus, for measuring a net charging current or voltage applied to a selected wafer or wafers mounted in an ion implantation system. Briefly, and in general terms, the method of the invention comprises the steps of directing an ion beam toward at least one semiconductor wafer that is subject to ion implantation processing, directing electrons toward the semiconductor wafer with the ion beam, to minimize charge buildup on the wafer, sensing the position of at least one selected wafer with respect to the ion beam, and generating a control signal when the selected wafer is within a preselected position window with respect to the ion beam. In response to the control signal, the method of the invention senses an electrical signal indicative of the net charging current received by the selected wafer, and the final step of the method is controlling, in response to the net current or voltage signal, the generation of electrons used to neutralize the ion beam. More precise control of charge buildup on the wafers is obtained by sensing the current only in reponse to ions and electrons impinging on the selected wafer, rather than on dummy wafers or simply on some other portion of the wheel assembly.

In the illustrative embodiment of the invention, the selected wafer is carried with other wafers near the periphery of a wheel assembly, and ion implantation processing includes rotating the wheel assembly about an axis, to move the wafers through the ion beam in a first direction, and moving the axis of the wheel assembly to scan the wafers back and forth through the beam in a second direction.

The step of generating a control signal when the selected wafer is within a preselected position window includes sensing the angular position of the wheel assembly, comparing the angular position of the wheel with angle values defining two radial boundaries of the position window, sensing the position of the axis of the wheel assembly, comparing the position of the axis with position values defining two scanning boundaries of the position window, and generating the control signal only when wheel angular position and axis position are within the radial boundaries and scanning boundaries of the position window. The step of sensing an electrical signal indicative of the net charging current in response to the control signal includes continuously sensing the net current passing through the wheel assembly, or sensing an equivalent voltage, and sampling the continuously sensed net current in response to the control signal.

The method of the invention may also include the steps of sensing a second electrical signal indicative of charging current when the wheel assembly is positioned such that a second selected wafer is receiving the ion beam, and combining the two sensed electrical signals, to obtain a composite signal for use in the step of controlling the generation of electrons.

In terms of novel apparatus for controlling charging current in an ion implantation system, the invention comprises means for generating an ion beam and directing it toward at least one semiconductor wafer that is subject to ion implantation processing, means for generating electrons to be directed toward the semiconductor wafer with the ion beam, to minimize charge buildup on the wafer, means for sensing the position of at least one selected wafer with respect to the ion beam, and means for generating a control signal when the selected wafer is within a preselected position window with respect to the ion beam. The apparatus further includes means operable in response to the control signal, for sensing a net current or voltage signal indicative of electrical charge received by the selected wafer, and means for controlling the generation of electrons in response to the net current signal, whereby more precise control of the charging current is obtained by sensing the current only in response to ions and electrons impinging on the selected wafer.

It will be appreciated from the foregoing that the present invention represents a significant advance in the field of ion implantation systems. In particular, the invention provides a more effective way to control electron flood generation to neutralize the undesirable charging effect of the ions. Charging current or voltage is sensed only with respect to a selected semiconductor wafer, rather than being continuously sensed as in prior systems. Other aspects and advantages of the invention will become apparent from the following more detailed description, taken in conjunction with the accompanying drawings.

DESCRIPTION OF THE PREFERRED EMBODIMENT

Figure 1:
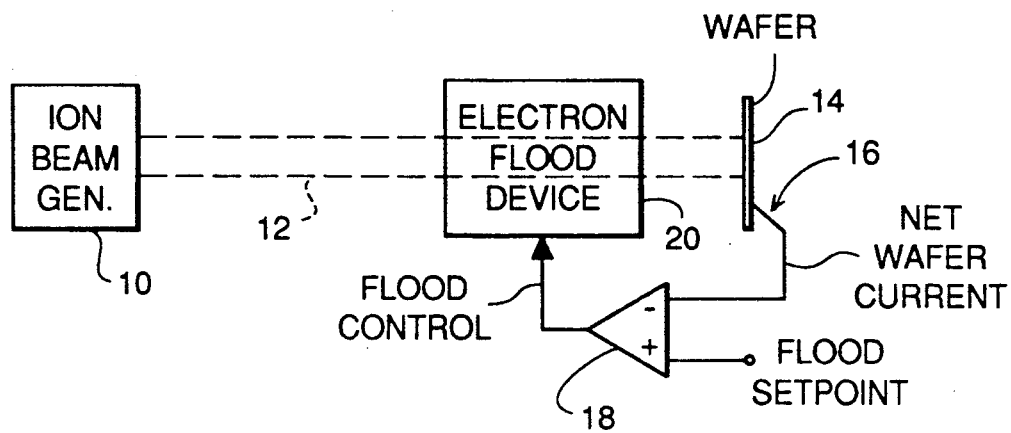
FIG. 1 is a simplified schematic representation of an ion implantation system of the prior art, showing in particular the closed-loop control of an electron flood device used to neutralize the electrical charge applied to wafers being processed by the ion beam.

As shown in the drawings for purposes of illustration, the present invention is concerned with ion implantation systems used in the fabrication of integrated circuits. As is well known, integrated circuits or "chips" are typically made on a semiconductor wafer that usually contains an array of many such chips, which are subsequently separated. In a number of semiconductor fabrication processes, impurities are added to selected regions of a circuit by exposing the regions to a beam of ions. Selectivity in the implantation process is obtained by first putting down on the wafer a mask that is practically impervious to ions; then patterning the mask to expose only those regions that are to be processed by ion implantation. The entire wafer may then be flooded with ions, using a selected dosage in terms of time, beam intensity, and ion energy.

FIG. 1 shows the essential features of an ion implantation system, including an ion beam generator, indicated by reference numeral 10, which produces an ion beam 12, usually enclosed within a suitable structure (not shown). The beam 12 is shown as impinging on a semiconductor wafer 14. The charging current applied to the wafer 14 is sensed, as indicated at 16, and applied to an operational amplifier 18, together with a signal indicating a desired or setpoint level of electron flood operation. The output of the amplifier, which is proportional to the difference between the two inputs, is used to control an electron flood device 20 interposed between the ion beam generator 10 and the wafer 14. If, for example, the net wafer current (i.e. electron flow) should increase, the difference between the flood setpoint signal and the amplifier input proportional to wafer current would decrease, and the electron flood device 20 would be controlled to produce fewer electrons, thereby reducing the charging current.

Figure 2:
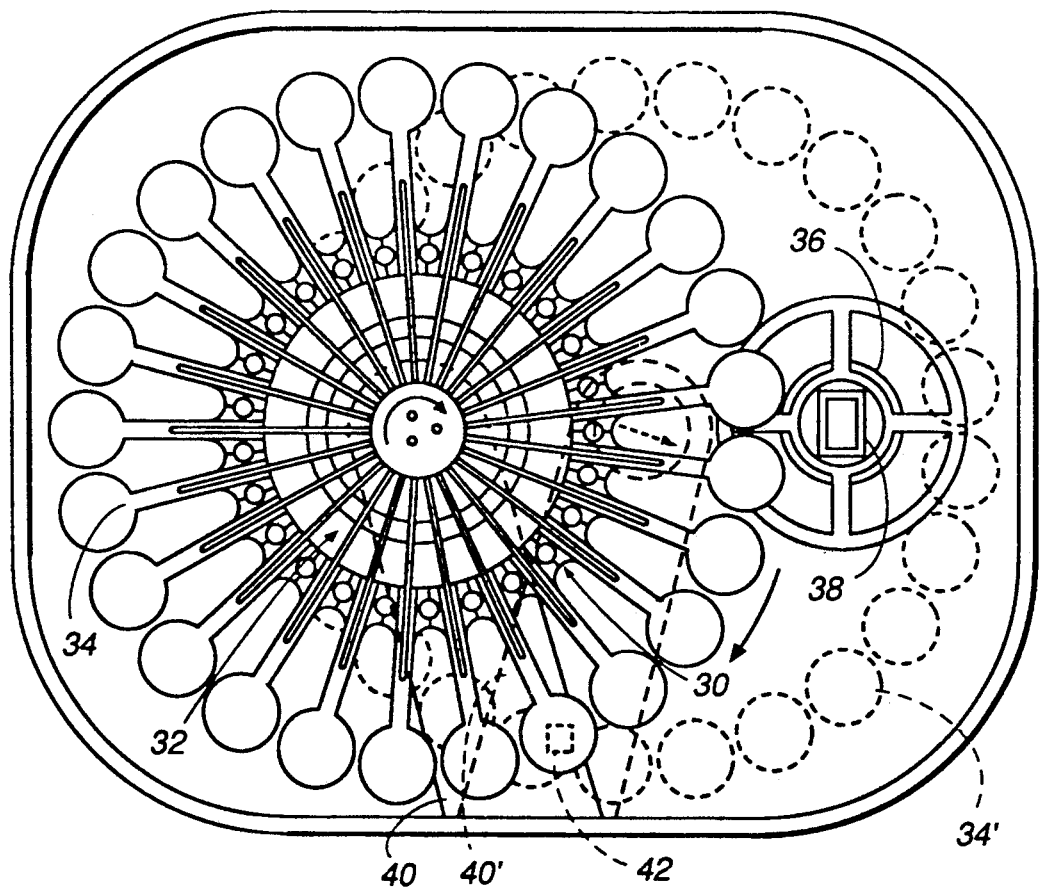
FIG. 2 is a simplified elevational view of a wheel assembly used to carry wafers for processing in the present invention and in ion implantation systems of the prior art.

FIG. 2 depicts a scan wheel assembly 30 on which wafers, such as the wafer 14 (FIG. 1), are mounted for ion implantation processing. The scan wheel assembly 30 has a central hub 32 on which are mounted twenty-five radially disposed heat sink assemblies 34, each of which carries a semiconductor wafer (not shown in FIG 2) for ion implantation processing. Ions are accelerated along an ion generation assembly 36, and in particular emerge from a tube 38 of rectangular cross section.

The wheel assembly 30 is mounted for rotation at the end of a pivoted arm 40, which is moved by conventional means (not shown) between a first angular position, as depicted, and a second angular position, depicted in broken lines and indicated at 40'. Outlines of the heat sink assemblies when the wheel is carried to this second position are indicated by broken lines, at 34'. Scanning movement of the wheel assembly 30, by cyclical movement of the pivot arm 40, scans the wafers slowly across the ion beam 12, while the wheel is rapidly rotating at approximately 1,250 revolutions per minute (rpm). Thus the wafers (including possible dummy wafers), positioned on the heat sink assemblies 34 of the wheel, are exposed to the ion beam 12 in an intermittent but relatively uniform manner. It will be seen, however, that for some portions of the scanning motion the beam will impinge on the hub assembly of the wheel, and that at other times the beam will miss the wheel assembly entirely. Measurement of charging current received by the wafers on the wheel is made by sensing the current through a slip-ring assembly (not shown) at the wheel axis. This provides an approximate measure of the charging current being received by the wafers carried on the wheel, but takes no account of differences due to beam position relative to the wheel. Moreover, some of the sink assemblies may be loaded with dummy wafers rather than real wafers. For all these reasons, the average current sensed at the wheel hub may not be a good indication of the charging current received by a wafer.

In accordance with the invention, the charging current, or an equivalent voltage, is measured only while the ion beam is positioned within a selected window with respect to one or more of the wafers mounted on the wheel assembly. More specifically, the charging current is measured when the beam is positioned entirely on a wafer. Therefore, any variations in charging current resulting from different positions of the ion beam, such as over the wheel structure or over dummy wafers, are eliminated from the control system and have no effect on the control of the electron flood device. If voltage sensing is used, an electrostatic voltage sensor 42 mounted on the arm 40 senses the voltage on a selected wafer after it has passed through the ion beam and has rotated on the wheel to a position immediately adjacent to the voltage sensor.

Basically, measurement of the charging current is taken only within a positional window determined from the sensed position of the wheel, both its angular position and its position in the lateral scanning cycle. Conventional sensors are employed to determine these positions. A wheel angle sensor 50 (FIG. 3) may take the form of a shaft encoder mounted at the axis of the wheel assembly 30, producing an electrical signal indicative of the angular position $\theta$ of the wheel, between $0°$ and $359°$. A start monitor angle $\alpha 1$, indicated in block 52, and a stop monitor angle $\alpha 2$, indicated in block 54, are continuously compared with the wheel angle in comparators 56 and 58, respectively. Similarly, a wheel scan position sensor 60, which may take the form of a shaft encoder mounted on the pivot axis of the pivot arm 40, supplies a wheel scan position signal S to two additional comparators 62, 64. A start monitor position P1 and a stop monitor position P2, shown in blocks 66, 68, are also supplied to the comparators 62, 64. Comparators 56, 58 generate digital outputs indicating whether $\theta \geq \alpha 1$ and $\theta < \alpha 2$, respectively. Similarly, comparators 62 and 64 generate digital outputs indicating whether $S > P1$ and $S < P2$, respectively. The combined outputs of the four comparators 56, 58, 62, 64 provide an indication of when the position of the wheel is within the selected position window defined by the four start and stop parameters. If the sensors 50, 60 are shaft encoders, providing digital output signals, the functions of the comparators can best be performed digitally, either in software or in equivalent hardwired form.

The comparator outputs are logically ANDed, as indicated at 70. The resultant output signal, on line 72, indicates when the wheel is in such a position that the ion beam 12 is over a selected portion of a selected wafer on the wheel. Current is detected in the same conventional manner as in systems of the prior art, is converted to a corresponding voltage signal in a current-voltage converter 74, and, in accordance with the invention, is sampled and held in a sample and hold circuit circuit 76 controlled by the AND gate output signal on line 72. As in conventional control systems, the sampled signal proportional to charging current is input to an operational amplifier 78, together with a flood setpoint signal, the output of the amplifier being used to control the electron flood device Because the control of electron flooding is based solely on a charging current signal sensed while the ion beam is positioned on a wafer, charging effects of the ion beam can be practically eliminated. If desired, the charging current, or an equivalent voltage, may be sensed each time the beam is positioned on any of several wafers, instead of simply a single wafer, and the resultant electrical signal samples then averaged or otherwise combined before use in the control of the electron flood device.

Figure 3:
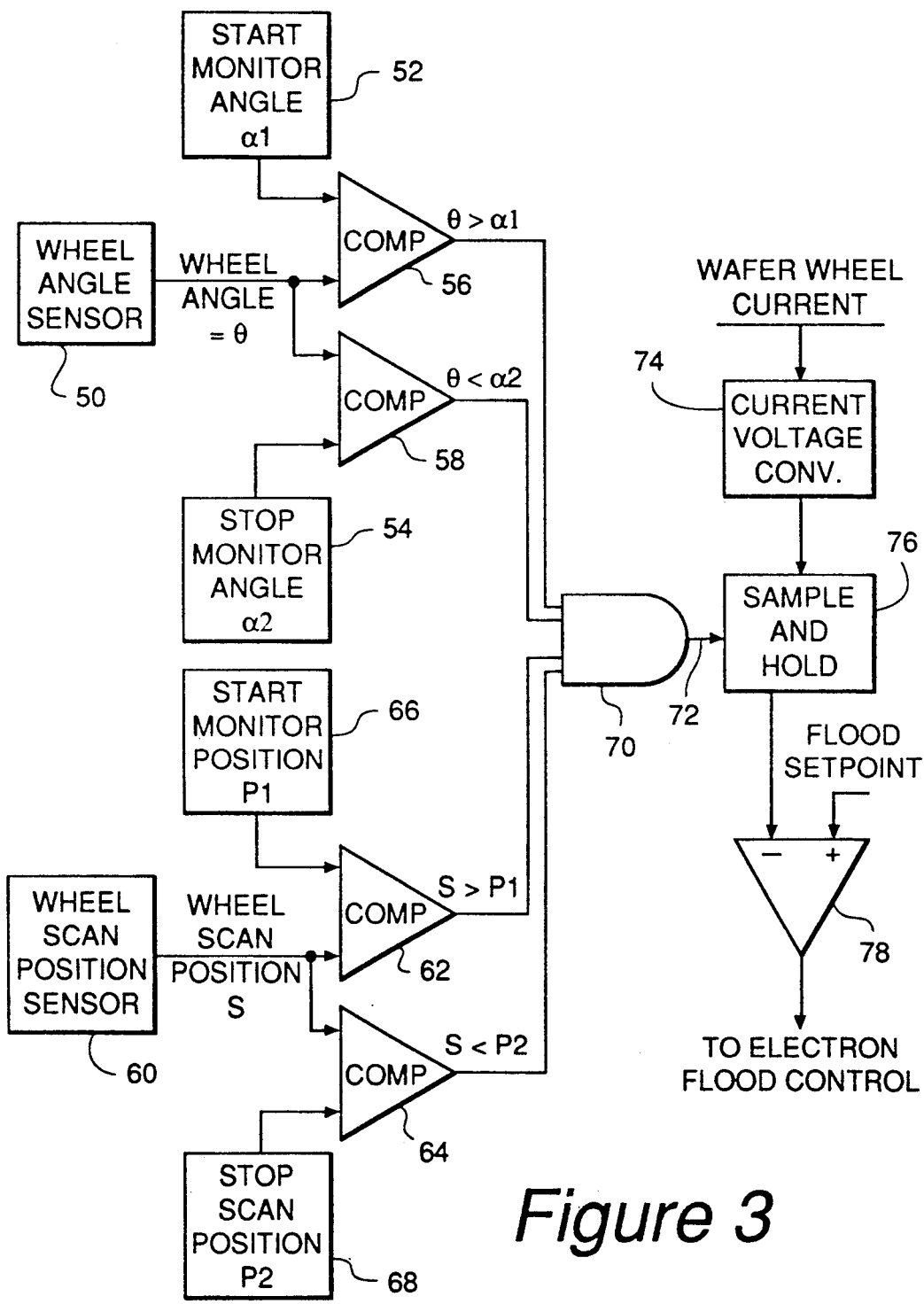
FIG. 3 is schematic diagram of the control system of the present invention, for ensuring that charging current is sensed only when the ion beam is positioned over a semiconductor wafer being processed.

The schematic diagram of FIG. 3 needs slight modification if voltage sensing is used instead of current sensing. Obviously, no current-to-voltage conversion is needed, but the voltage signal may need to be amplified or processed in other ways, depending on the nature of the sensor output. Also, the control signal on line 72 must be delayed for a time sufficient to allow the selected wafer to move from a position in the ion beam to a position immediately adjacent to the electrostatic voltage sensor 42.

It will be appreciated from the foregoing that the present invention represents a significant advance in the field of ion implantation systems. In particular, the invention provides for sensing of charging current only when the wafer-carrying wheel assembly is in such a position that the ion beam is impinging completely on a selected wafer, or on one of multiple selected wafers, thereby providing a meaningful measure of current. It will also be appreciated that, although an embodiment of the invention has been described in detail for purposes of illustration, various modifications may be made without departing from the spirit and scope of the invention. Accordingly, the invention is not to be limited except as by the appended claims.

We claim:

1. A method for controlling electrical charge in an ion implantation system, comprising the steps of:
   directing an ion beam along a path toward one or more semiconductor wafers that are subject to ion implantation processing, wherein one of the wafers is designated a selected wafer;
   directing electrons toward the semiconductor wafer or wafers with the ion beam, to minimize charge buildup on the wafer or wafers;
   effecting a relative scanning movement between the ion beam and the wafer or wafers, wherein the ion beam covers a scanned area that includes the wafer or wafers, as well as a significant off-wafer area;
   sensing the position of the selected wafer with respect to the ion beam;
   generating a control signal only when a portion of the selected wafer is positioned in the path of the ion beam;
   in response to the control signal, sensing an electrical signal indicative of the net charging current received by the selected wafer; and
   controlling the generation of electrons in response to the electrical signal, whereby more precise control of charge buildup on the wafers is obtained by sensing the electrical signal only in response to ions and electrons impinging on the selected wafer.

2. A method for controlling electrical charge in an ion implantation system, comprising the steps of:
   directing an ion beam along a path toward one or more semiconductor wafers that are subject to ion implantation processing, wherein one of the wafers is designated a selected wafer;
   directing electrons toward the semiconductor wafer or wafers with the ion beam, to minimize charge buildup on the wafer or wafers;
   sensing the position of the selected wafer with respect to the ion beam;
   generating a control signal when a portion of the selected wafer is positioned in the path of the ion beam;
   in response to the control signal, sensing an electrical signal indicative of the net charging current received by the selected wafer; and
   controlling the generation of electrons in response to the electrical signal, whereby more precise control of charge buildup on the wafers is obtained by sensing the electrical signal only in response to ions and electrons impinging on the selected wafer;
   wherein the selected wafer is carried with other wafers near the periphery of a wheel assembly;
   and wherein ion implantation processing includes rotating the wheel assembly about an axis to move the wafers through the ion beam in a first direction, and moving the axis of the wheel assembly to scan the wafers back and forth through the beam in a second direction;
   and wherein the step of generating a control signal includes
   sensing the angular position of the wheel assembly,
   comparing the angular position of the wheel with angle values defining two radial boundaries of a position window of the selected wafer,
   sensing the position of the axis of the wheel assembly,
   comparing the position of the axis with position values defining two scanning boundaries of the position window of the selected wafer, and
   generating the control signal only when the wheel radial position and axis position are within the radial boundaries and scanning boundaries, respectively, of the position window.

3. A method as defined in claim 2, wherein:
   the step of sensing an electrical signal indicative of the net charging current in response to the control signal includes
   continuously sensing the current passing through the wheel assembly, and
   sampling the continuously sensed current in response to the control signal.

4. A method as defined in claim 2, the further comprising the steps of:
   sensing at least one additional electrical signal indicative of charging current when the wheel assembly is positioned such that a portion of at least a second selected wafer is receiving the ion beam; and
   combining the multiple sensed electrical signals indicative of charging current, to obtain a composite charging current signal for use in the step of controlling the generation of electrons.

5. Apparatus for controlling electrical charge in an ion implantation system, comprising:
   means for generating an ion beam and directing it along a path toward one or more semiconductor wafers that are subject to ion implantation processing, wherein one of the wafers is designated a selected wafer;
   means for generating electrons to be directed toward the semiconductor wafer or wafers with the ion beam, to minimize charge buildup on the wafer or wafers;
   means for effecting a relative scanning movement between the ion beam and the wafer or wafers, wherein the ion beam covers a scanned area that includes the wafer or wafers as well as a significant off-water area;
   means for sensing the position of the selected wafer with respect to the ion beam;
   means for generating a control signal only when a portion of the selected wafer is positioned in the path of the ion beam;
   means operable in response to the control signal, for sensing an electrical signal indicative of charging current received by the selected wafer; and
   means for controlling the generation of electrons in response to the electrical signal, whereby more precise control of charge buildup on the wafers is obtained by sensing the current only in response to ions and electrons impinging on the selected wafer.

6. Apparatus for controlling electrical charge in an ion implantation system, comprising:
   means for generating an ion beam and directing it along a path toward one or more semiconductor wafers that are subject to ion implantation processing, wherein one of the wafers is designated a selected wafer;
   means for generating electrons to be directed toward the semiconductor wafer or wafers with the ion beam, to minimize charge buildup on the wafer or wafers;
   means for sensing the position of the selected wafer with respect to the ion beam;

means for generating a control signal when a portion of the selected wafer is positioned in the path of the ion beam;

means operable in response to the control signal, for sensing an electrical signal indicative of charging current received by the selected wafer;

means for controlling the generation of electrons in response to the electrical signal, whereby more precise control of charge buildup on the wafers is obtained by sensing the current only in response to ions and electrons impinging on the selected wafer;

a wheel assembly for carrying the selected wafer and any other wafers around the periphery of a circle;. and means for rotating the wheel assembly about an axis to move the wafers through the ion beam in a first direction, and for moving the axis of the wheel assembly to scan the wafers back and forth through the beam in a second direction;

and wherein the means for generating a control signal includes means for sensing the angular position of the wheel assembly, means for comparing the angular position of the wheel with angle values defining two radial boundaries of a position window of the selected wafer, means for sensing the position of the axis of the wheel assembly, means for comparing the position of the axis with position values defining two scanning boundaries of the position window of the selected wafer, and means for generating the control signal only when the wheel radial position and axis position are within the radial boundaries and scanning boundaries, respectively, of the position window.

7. Apparatus as defined in claim 6, wherein:

the means for sensing an electrical signal indicative of charging current in response to the control signal includes means for continuously sensing the net current passing through the wheel assembly, and means for sampling the continuously sensed net current in response to the control signal.

8. Apparatus as defined in claim 6, and further comprising:

means for sensing at least one additional electrical signal indicative of charging current when the wheel assembly is positioned such that a portion of at least one additional selected wafer is receiving the ion beam; and means for combining the multiple sensed electrical signals indicative of charging current, to obtain a composite charging current signal for use in the step of controlling the generation of electrons.

9. A method as defined in claim 1, wherein:

the selected wafer and any other wafers are carried near the periphery of a wheel assembly;

the step of effecting relative movement includes rotating the wheel assembly about an axis, to move the wafers in a circumferential direction through the ion beam, and cyclically moving the axis to scan the wafers on the wheel assembly in a generally radial direction; and the step of sensing the position of the selected wafer includes sensing the angular position of the wheel assembly and the position of the wheel assembly axis.

10. Apparatus as defined in claim 5, wherein:

the apparatus further comprises a wheel assembly for carrying the selected wafer and any other wafers around the periphery of a circle;

the means for effecting relative movement includes means for rotating the wheel assembly about an axis, to move the wafers in a generally circumferential direction through the ion beam, and means for cyclically moving the axis to scan the wafers on the wheel assembly in a generally radial direction; and the means for sensing the position of the selected wafer includes sensing the angular position of the wheel assembly and the position of the wheel assembly axis.

* * * * *